United States Patent
Kobayashi

(10) Patent No.: US 7,135,896 B2
(45) Date of Patent: Nov. 14, 2006

(54) OUTPUT BUFFER CIRCUIT AND SEMICONDUCTOR INTEGRATED CIRCUIT

(75) Inventor: Hideaki Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 44 days.

(21) Appl. No.: 11/093,032

(22) Filed: Mar. 30, 2005

(65) Prior Publication Data

US 2005/0218945 A1 Oct. 6, 2005

(30) Foreign Application Priority Data

Mar. 31, 2004 (JP) .............................. 2004-103387

(51) Int. Cl.
*H03K 3/00* (2006.01)

(52) U.S. Cl. ....................... 327/108; 327/112; 327/158; 327/167; 324/76.77; 324/76.78; 324/76.79

(58) Field of Classification Search ...................... None
See application file for complete search history.

(56) References Cited

U.S. PATENT DOCUMENTS

| | | | | |
|---|---|---|---|---|
| 5,686,855 A * | 11/1997 | Lee | .............................. | 327/378 |
| 5,955,904 A * | 9/1999 | Kawasaki | .................... | 327/156 |
| 6,052,011 A * | 4/2000 | Dasgupta | .................... | 327/270 |
| 6,205,086 B1* | 3/2001 | Hanzawa et al. | ............ | 365/233 |
| 6,212,126 B1* | 4/2001 | Sakamoto | .................... | 365/233 |
| 6,236,695 B1* | 5/2001 | Taylor | ......................... | 375/372 |
| 6,259,288 B1* | 7/2001 | Nishimura | ................... | 327/156 |
| 6,285,214 B1* | 9/2001 | Zipper | ......................... | 326/83 |
| 6,313,674 B1* | 11/2001 | Akita et al. | ................. | 327/155 |
| 6,339,553 B1* | 1/2002 | Kuge | .......................... | 365/194 |
| 6,552,587 B1* | 4/2003 | Kim et al. | .................. | 327/158 |
| 6,603,687 B1* | 8/2003 | Jun et al. | ..................... | 365/194 |
| 6,829,316 B1* | 12/2004 | Terada et al. | ............... | 375/355 |

FOREIGN PATENT DOCUMENTS

JP 2000-332595 11/2000

* cited by examiner

*Primary Examiner*—Tuan T. Lam
*Assistant Examiner*—Hiep Nguyen
(74) *Attorney, Agent, or Firm*—Foley & Lardner LLP

(57) ABSTRACT

Replica output buffers, having the same input/output characteristic as that of an output buffer, respond to the rise of a TEST signal generated by a test pulse generating circuit and causes an output signal to rise at a through rate according to voltage of an SL_SET signal, and causes an output signal to fall at a through rate according to voltage of a CNT signal. A phase comparing circuit makes a comparison between phases of the signals output from the replica output buffers, and outputs an UP signal or Down signal with a length corresponding to a phase difference to a delay control circuit. The delay control circuit changes the voltage of the CNT signal according to the UP signal and the DOWN signal, and adjusts a through rate at which a signal output from the output buffer falls.

3 Claims, 6 Drawing Sheets

REPLICA OUTPUT BUFFER 120

OUTPUT BUFFER CIRCUIT AND SEMICONDUCTOR INTEGRATED CIRCUIT

BACKGROUND OF THE INVENTION

1. Field of the Invention

The present invention relates to an output buffer circuit and semiconductor integrated circuit.

2. Description of the Related Art

There is known an inter-LSI data transmission technique in which an LSI of a transmitting side transmits a strobe signal and a data signal to an LSI of a receiving side with a suitable phase difference and the LSI of the receiving side synchronizes a transmission operation with the received strobe signal to receive the data signal.

FIG. 6 illustrates a conventional output buffer circuit and a receiving circuit for inter-LSI data communication.

As illustrated in the figure, an LSI 2 of the transmitting side includes latches 470 and 471 and output buffers 480 and 481. An LSI 3 of the receiving side includes input buffers 490 and 491 and a latch 500.

Each of the output buffers 480 and 481 includes a buffer circuit as illustrated in FIG. 1 of, for example, Unexamined Japanese Patent Application KOKAI Publication No. 2000-332595. This buffer circuit adjusts a trough rate of an output waveform regardless of the magnitude of a load connected to the receiving side.

In such the configuration, since a threshold voltage Vref differs depending on LSI, even if such the buffer circuit is applied, a rise time and a fall time of DATA_OUT signal are varied. Accordingly, a margin of a set-up time or hold time is reduced at the receiving side.

When the set-up time or hold time is set shorter than a certain predetermined time, the output waveform is distorted to cause an erroneous operation in data transmission. When the margin of the set-up time or hold time is reduced, an increase in transmission speed is prevented. For this reason, it is required that delay time when the data signal rises should be the same as delay time when the data signal falls at the LSI of the receiving side.

The present invention has been made with consideration given to the aforementioned problem and an object of the present invention is to attain data transfer with a small number of erroneous operations and high reliability.

Moreover, another object of the present invention is to provide an output buffer circuit and semiconductor integrated circuit that can adjust a through rate in such a way that delay time when a data signal rises is the same as delay time when a data signal falls.

SUMMARY OF THE INVENTION

An output buffer circuit according to a first aspect of the present invention includes an output buffer which outputs input data at a through rate according to a control signal; a pulse generating circuit which generates a test pulse; two replica buffers which operate each other in opposite phase, which have the same input/output characteristic as that of the output buffer, and which input the test pulse generated by the pulse generating circuit to output the test pulse at the through rate according to the control signal; and a through rate control circuit which varies the control signal according to a phase difference between output signals of the two buffers to output the control signal to the output buffer and the two replica buffers.

The through rate control circuit may include a phase comparing circuit that detects timing at which signal levels of output signals of the replica buffers are the same as a predetermined reference level to output a phase difference signal corresponding to a phase difference in the timing, and vary a control voltage value that is output according to the phase difference signal output by the phase comparing circuit.

A semiconductor integrated circuit according to a second aspect of the present invention integrates an output buffer circuit on a semiconductor substrate. The output buffer circuit includes a pulse generating circuit which generates a test pulse; two replica buffers which operate each other in opposite phase, each which has the same input/output characteristic as that of the output buffer, and each which inputs the test pulse generated by the pulse generating circuit to output the test pulse; a buffer through rate control circuit which varies a control voltage according to a phase difference between test signals output by the two buffers to output the control voltage; and an output buffer which adjusts a through rate of a data signal output according to the control voltage output by the buffer through rate control circuit, wherein the two replica buffers adjust the through rate of the test signal output according to the control voltage output by the buffer through rate control circuit.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

The following will explain an output buffer circuit according to an embodiment of the present invention.

The present output buffer circuit is mounted on a large scale integrated circuit (LSI) 1. The LSI 1 receives data and an instruction of data processing from another apparatus and executes predetermined data processing, and outputs the result from an output pad. Each section of the LSI 1 is operated in synchronization with a clock (CLK) signal supplied from a clock supply source.

Figure 1:
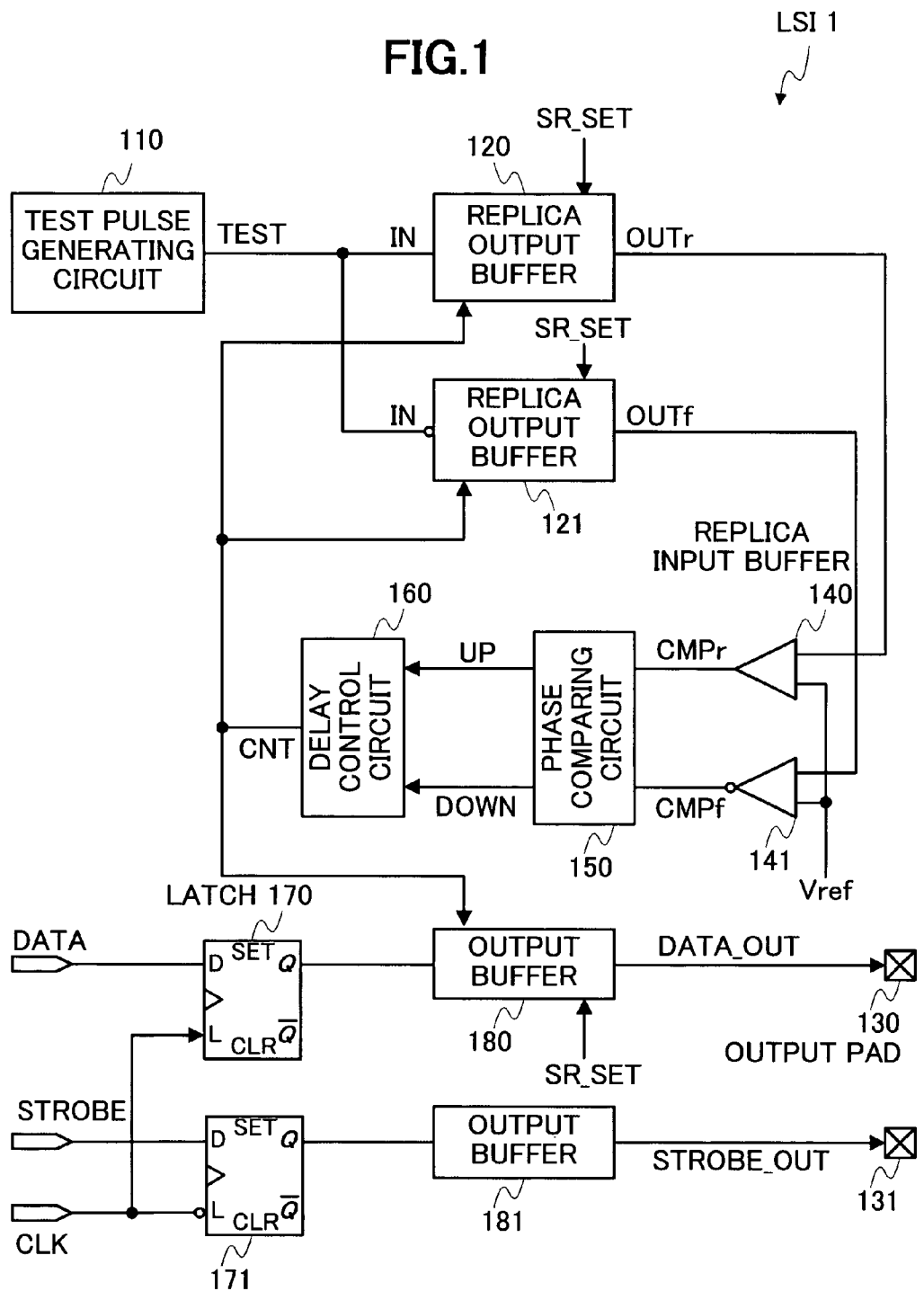
FIG. 1 is a block diagram illustrating an output buffer circuit mounted on a semiconductor integrated circuit according to an embodiment of the present invention.

As illustrated in FIG. 1, the output buffer circuit according to the present embodiment includes a test pulse generating circuit 110, replica output buffers 120, 121, replica input buffers 140, 141, a phase comparing circuit 150, a delay control circuit 160, latches 170, 171, and output buffers 180, 181.

The test pulse generating circuit 110 generates a test (TEST) signal and inputs the generated TEST signal to the replica output buffers 120 and 121. Additionally, timing at which the TEST signal is generated is not particularly limited. However, it is desirable that the TEST signal be generated at an initializing time just after when the LSI 1 is powered on to execute through rate adjustment processing explained later. The through rate adjustment is executed at this point in time, so that delay time of a rise time is the same as delay time of a fall time in connection with a data output signal output by the LSI 1 when data is transmitted later. Moreover, in order to cope with variations in delay time of the rise time and the fall time after an operation, the test pulse generating circuit 110 may generate a TEST signal at suitable intervals (for example, 10 minutes) to adjust the through rate.

The replica output buffer 120 has the same input/output characteristic as that of the output buffer 180, buffers the TEST signal input from an IN input terminal, and outputs a signal OUTr from an output terminal. The replica output buffer 120 sets a through rate at which the signal OUTr rises according to a reference through rate voltage input from an SR_SET input terminal. The replica output buffer 120 also sets a through rate at which the signal OUTr falls according to voltage of a through rate control (CNT) signal input from a CNT input terminal. In the case where the voltage of the CNT signal is a certain reference voltage, the OUTr signal falls at a reference through rate. In the case where the voltage of the CNT signal is higher than the reference voltage, the OUTr signal falls at a through rate higher than the reference through rate according to the voltage value. In the case where the voltage of the CNT signal is lower than the reference voltage, the OUTr signal falls at a through rate lower than the reference through rate according to the voltage value. Additionally, the relationship between an amount of change in the voltage of the CNT signal and an amount of change in the through rate is experimentally set in such a way that through rate adjustment time becomes short and a set-up time and a hold time are prevented from being (transiently) too shortened by variations in the through rate.

Figure 2:
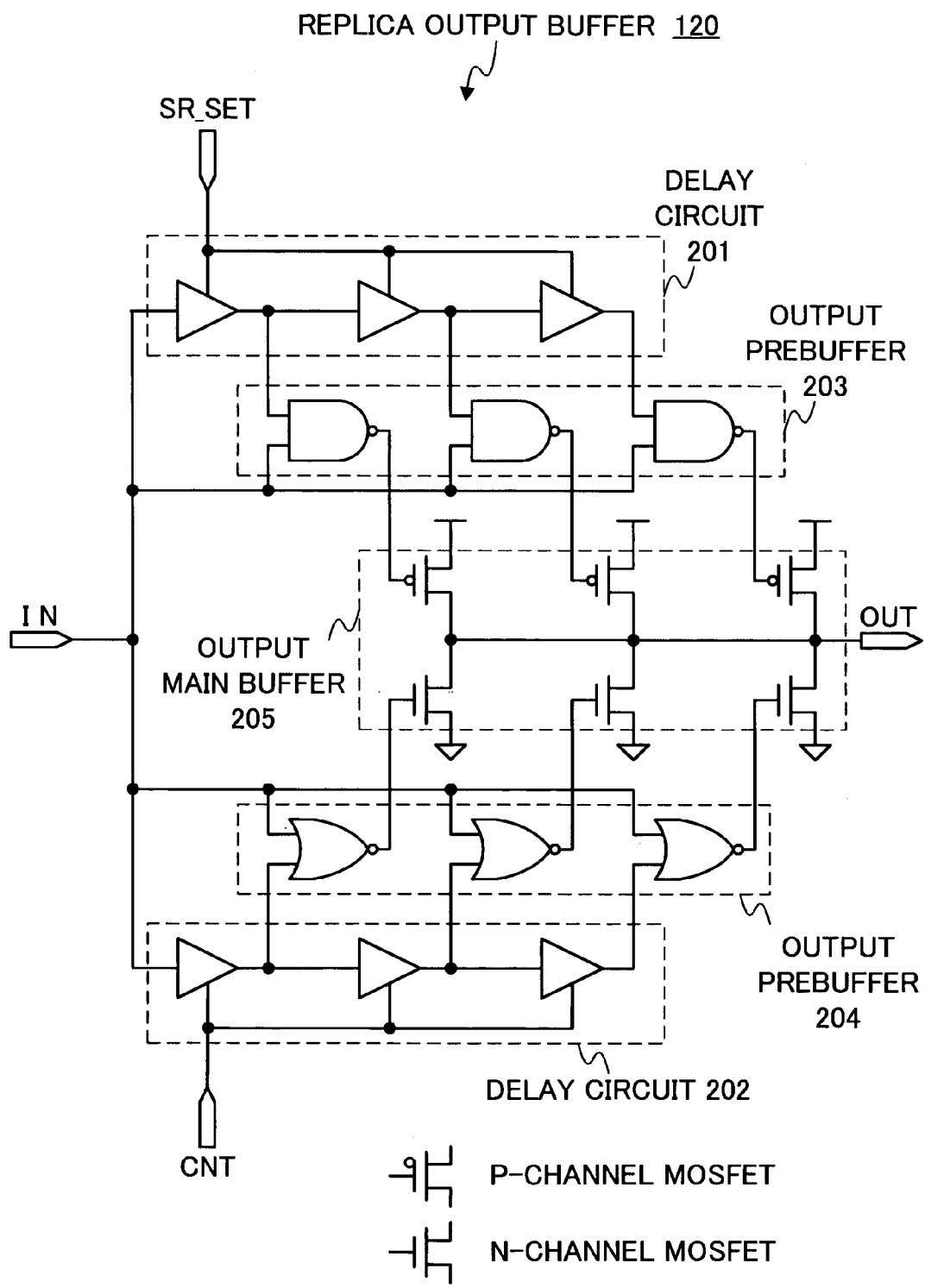
FIG. 2 is a block diagram explaining a configuration of a replica output buffer illustrated in FIG. 1.

FIG. 2 is a block diagram of the replica output buffer 120. As illustrated in the figure, the replica output buffer 120 includes delay circuits 201, 202, output prebuffers 203, 204, and an output main buffer 205.

The delay circuit 201 includes, for example, delay circuits connected in a multi-stage manner, and outputs an input signal for delay time according to the voltage input from the SR_SET terminal.

The delay circuit 202 includes, for example, delay circuits connected in a multi-stage manner, and outputs the input signal for delay time according to the voltage input from the CNT terminal. When the voltage input from the CNT terminal is varied, delay time is varied accordingly at each delay circuit.

The output prebuffer 203 includes, for example, multiple NAND gates, and transmits a rising portion of a signal IN input from the IN terminal to the output main buffer 205 in a stepwise manner.

The output prebuffer 204 includes, for example, multiple NOR gates, and transmits a falling portion of a signal IN input from the IN terminal to the output main buffer 205 in a stepwise manner.

The output main buffer 205 includes, for example, transistors, and controls a through rate of a rising waveform of an output signal OUT by a waveform of an output signal of the output prebuffer 203. The output main buffer 205 also controls a through rate of a falling waveform of an output signal OUT by a waveform of an output signal of the output prebuffer 204.

Among the transistors of the output main buffer 205, each source of the transistor connected to the output prebuffer 203 is connected to a positive power source, and each gate is connected to an output of the corresponding NAND gate of the output prebuffer 203. Each drain is connected to an output terminal OUT and a drain of the transistor connected to the output prebuffer 204. Moreover, each gate of the transistor connected to the output prebuffer 204 is connected to an output of the corresponding NOR gate of the output prebuffer 204, and each source is connected to a negative power source.

Referring back to FIG. 1, the replica output buffer 121 has the same input/output characteristic as that of the output buffer 180, buffers a TEST signal reversely input from the IN input terminal, and outputs a signal OUTf from the output terminal. The replica output buffer 120 sets a through rate at which the signal OUTf rises according to the reference through rate voltage input from the SR_SET input terminal. The replica output buffer 120 also sets a through rate at which the signal OUTf falls according to voltage of the CNT signal input from the CNT input terminal. In the case where the voltage of the CNT signal is a certain reference voltage, the OUTf signal falls at the reference through rate. In the case where the voltage of the CNT signal is higher than the reference voltage, the OUTf signal falls at a through rate higher than the reference through rate according to the voltage value. In the case where the voltage of the CNT signal is lower than the reference voltage, the OUTf signal falls at a through rate lower than the reference through rate according to the voltage value. Additionally, the internal configuration of the replica output buffer 121 is the same as that of the replica output buffer 120.

Figure 6:
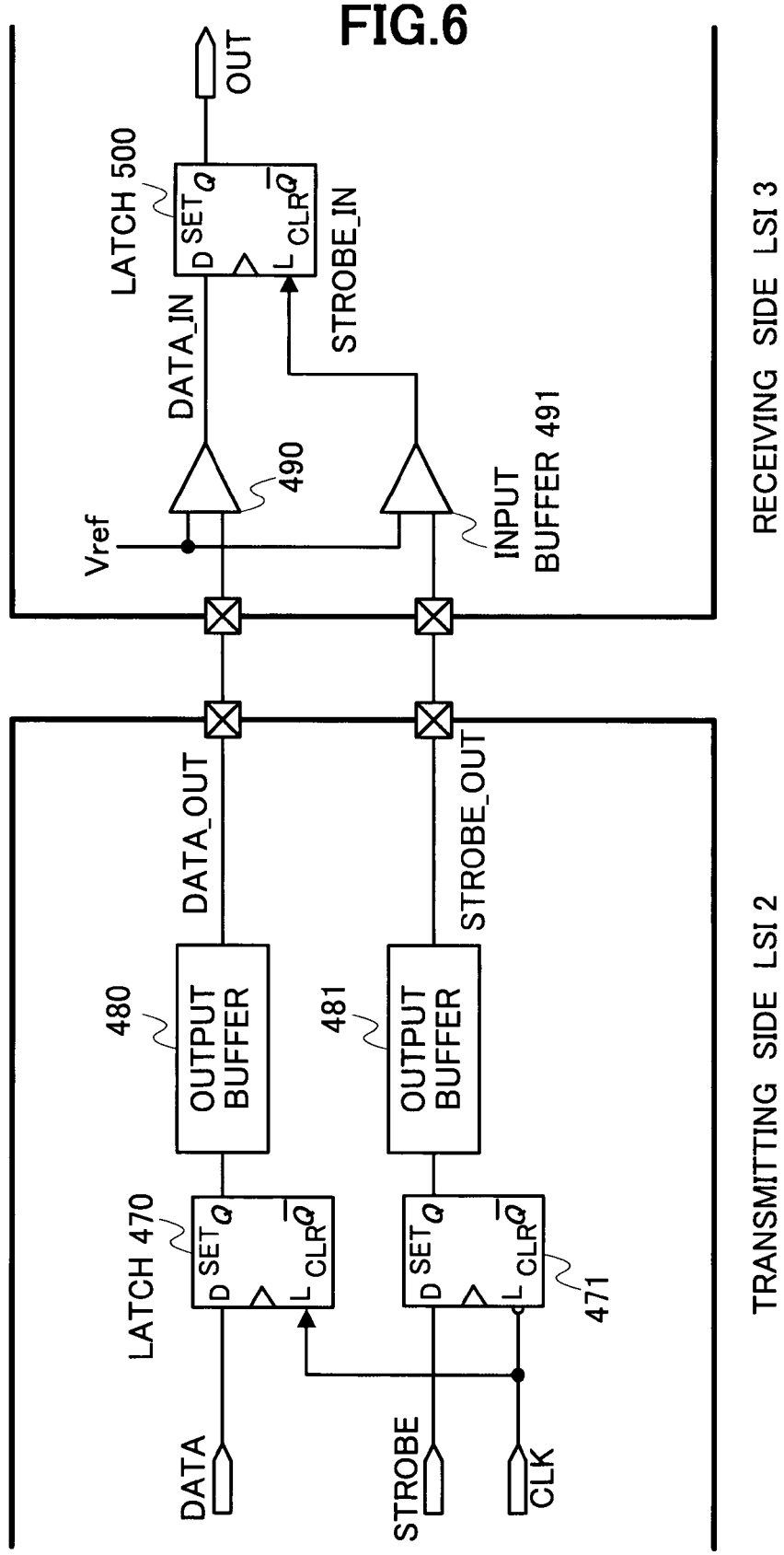
FIG. 6 is a block diagram of a conventional output buffer circuit.

The replica input buffer 140 has the same input/output characteristic as that of an input buffer 490 illustrated in FIG. 6. The replica input buffer 140 makes a comparison between an input voltage of the OUTr signal input from the replica output buffer 120 and a threshold voltage Vref. When the input voltage is higher than the threshold voltage, the replica input buffer 140 outputs an output signal CMPr with a high level. When the input voltage is lower than the threshold voltage, the replica input buffer 140 outputs an output signal CMPr with a low level. Additionally, the threshold voltage Vref is a threshold voltage used in the input buffer 490.

The replica input buffer 141 has the same input/output characteristic as that of an input buffer 490 illustrated in FIG. 6 excepting that the output is reversed. The replica input buffer 141 makes a comparison between an input voltage of the OUTf signal input from the replica output buffer 121 and the threshold voltage Vref. When the input voltage is higher than the threshold voltage, the replica input buffer 141 outputs an output signal CMPf with a high level. When the input voltage is lower than the threshold voltage, the replica input buffer 141 outputs an output signal CMPf with a high level.

The phase comparing circuit 150 includes a sequential circuit and detects a phase difference between the CMPr signal the CMPf. When the phase of the CMPr signal advances than the phase of the CMPf signal, the phase comparing circuit 150 outputs a phase advance (UP) signal, which indicates that the phase of the CMPr signal advances than the phase of the CMPf signal, to the delay control circuit 160. When the phase of the CMPr signal is delayed than the phase of the CMPf signal, the phase comparing circuit 150 outputs a phase delay (DOWN) signal, which indicates that the phase of the CMPr signal is delayed than the phase of the CMPf signal, to the delay control circuit 160. The UP signal and DOWN signal, which are output from the phase comparing circuit 150, are signals each having a length corresponding to the detected phase difference.

The delay control circuit 160 increases a voltage value of the CNT signal output according to a high-level period of the UP signal, and decreases a voltage value of the CNT signal output according to a high-level period of the DOWN signal. The CNT signal, which is output by the delay control circuit 160, is input to the replica output buffers 120, 121, and the output buffer 180.

The latch 170 latches a DATA signal input from a D port. Then, from time when a clock signal CLK input from an L port rises to the time when the clock signal CLK next rises, the latch 170 outputs a state of the DATA signal, which is at a previous rise time, to the output buffer 180 from a Q port.

The latch 171 latches a STROBE signal input from the D port. Then, from time when a clock signal CLK input from the L port falls (note that the CLK signal is reversely input to the L port) to the time when the clock signal CLK next falls, the latch 170 outputs a state of the STROBE signal, which is at a previous fall time, to the output buffer 181 from the Q port.

The output buffer 180 has the same input/output characteristic as that of the replica output buffer 120, buffers a signal input from the latch 170, and outputs a data output signal (DATA_OUT) from the output terminal. The output buffer 180 sets a through rate of the DATA_OUT signal according to the reference through rate voltage input from the SR_SET input terminal and the CNT signal voltage input from the CNT input terminal. Additionally, the internal configuration of the output buffer 180 is the same as that of the replica output buffer 120.

The output buffer 181 buffers a signal input from the latch 171 and outputs a strobe output (STROBE_OUT) signal from the output terminal.

Output pads 130 and 131 are places where signals output from the output buffers 180 and 181 are sent from the LSI 1, respectively.

Figure 3:
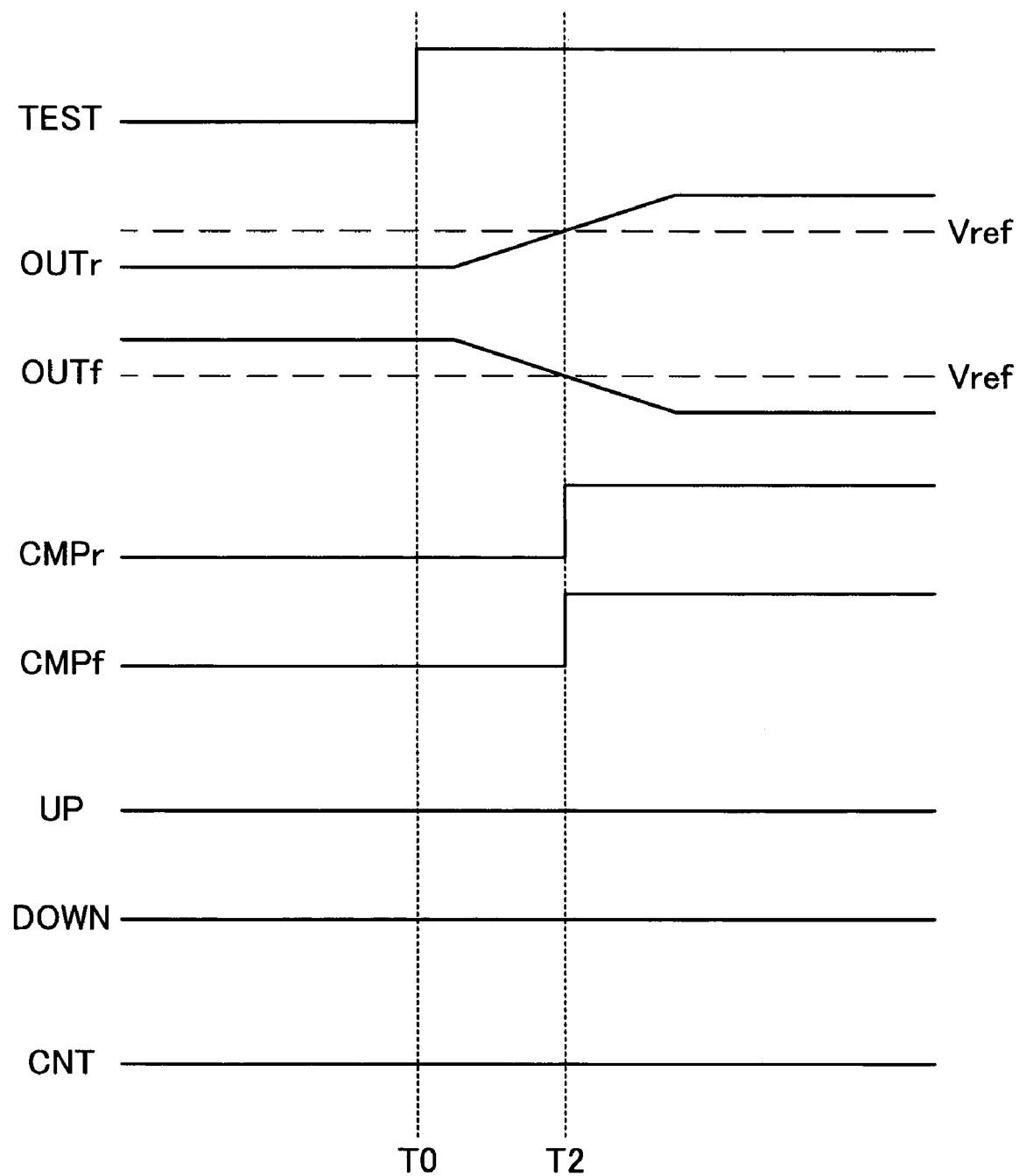
FIG. 3 is a timing chart explaining a general operation of a replica output buffer illustrated in FIG. 1.
Figure 4:
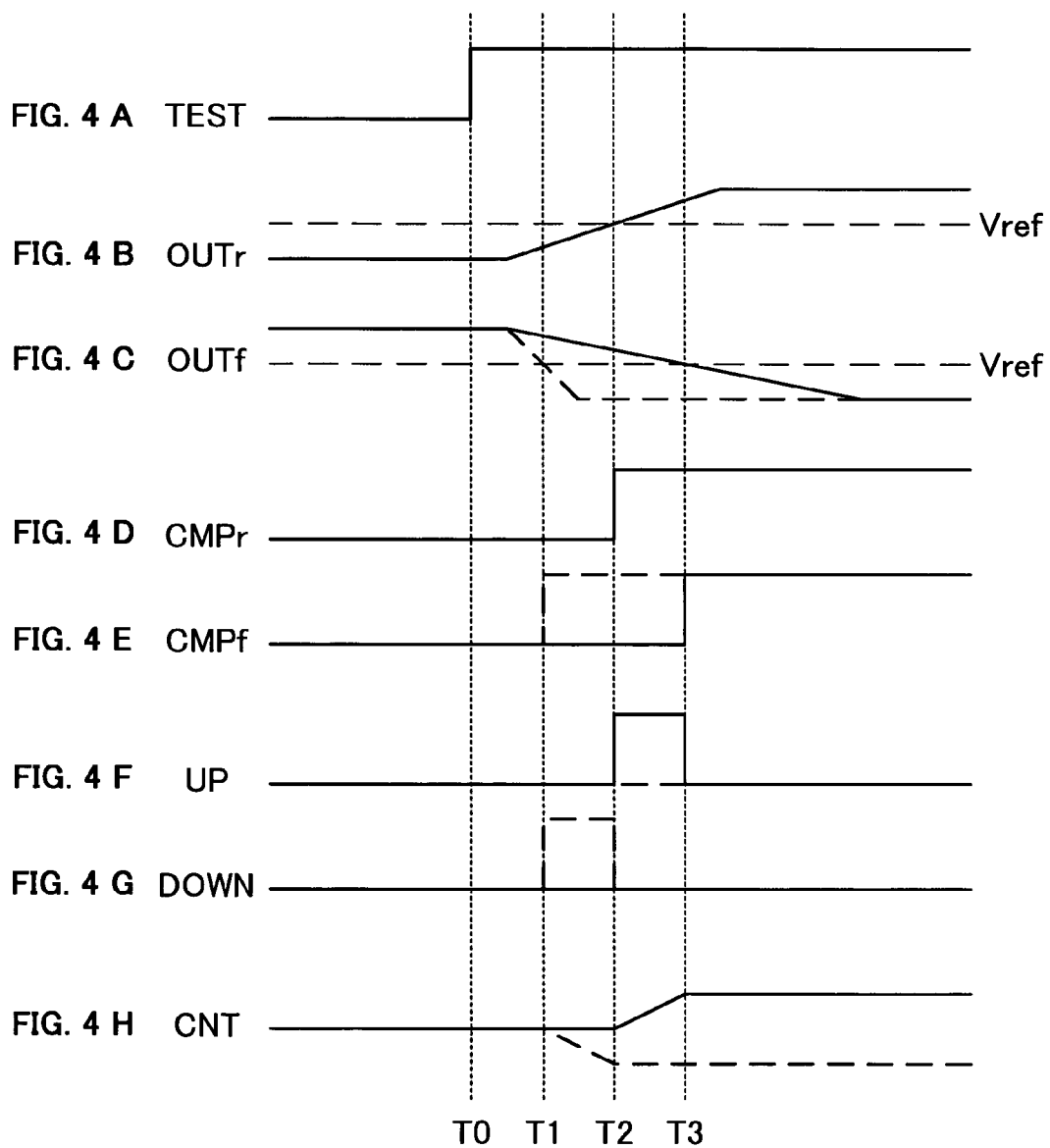
FIG. 4 is a timing chart explaining an operation of a replica output buffer illustrated in FIG. 1 when a rise time of a DATA_OUT signal illustrated in FIG. 3 is different from a fall time.

The following will explain an operation of the output buffer circuit according to the present embodiment with reference to timing charts of FIG. 3 and FIG. 4. FIG. 3 is a timing chart at a general operating time. FIG. 4 is a timing chart when the rise times of the output signals (DATA_OUT signal and STROBE_OUT signal) are different from the fall times. Additionally, in this operation example, since only the rise of the TEST signal is needed, the operation that is performed when the TEST signal falls is not explained.

Timing T0 of FIG. 3 is timing at which the TEST signal rises. In response to the rise of the TEST signal, the replica output buffer 120 outputs the TEST signal as an OUTr signal at delay time according to a voltage value of an SL_SET signal. While, in response to the rise of the TEST signal, the replica output buffer 121 outputs the TEST signal as an OUTf signal at delay time according to a voltage value of the CNT signal.

After timing T0, the OUTr signal rises and the OUTf signal falls. Then, at timing T2, the voltage value of the OUTr signal exceeds the threshold voltage Vref and the voltage value of the OUTf signal falls below the threshold voltage Vref. In this case, at the same timing T2, the CMPr signal and the CMPf signal rise. Since the phase comparing circuit 150 receives the CMPr signal and the CMPf signal that rise at the same timing T2, the output levels of the UP signal and the DOWN signal are unchanged. Accordingly, the voltage value of the CNT signal, which is output by the delay control circuit 160, is also unchanged.

Solid lines of FIG. 4 indicate a case in which the rise of the OUTr signal occurs earlier than the fall of the OUTf signal and dotted lines indicate a case in which the rise of the OUTr signal occurs later than the fall of the OUTf signal. An explanation will be first given of the case in which the rise of the OUTr signal indicated by the solid line occurs earlier than the fall of the OUTf signal. In addition, timing T0 and timing T2 are the same timing as illustrated in FIG. 3.

In this case, though the CMPr signal rises at timing T2, the CMPf signal does not rise at timing T2. For this reason, the UP signal rises at timing T2. As a result, the delay control circuit 160 gradually increases the voltage value of the outputting CNT signal at the same timing T2.

Timing T3 is timing at which the OUTf signal falls and is below the threshold voltage Vref. At timing T3, the CMPf signal rises and the phase comparing circuit 150 causes the UP signal to fall in response to the rise of the CMPf signal. As a result, the delay control circuit 160 keeps the voltage value of the outputting CNT signal at the level after timing T3.

The delay control circuit 160 increases the voltage value of the CNT signal, so that the replica output buffers 120, 121 and the output buffer 180 adjust the through rates at which various signals fall to be increased.

An explanation will be next given of the case in which the rise of the OUTr signal indicated by the solid line occurs later than the fall of the OUTf signal. Timing T1 is timing at which the OUTf signal falls and is below the threshold voltage Vref. In this case, the CMPf signal rises at timing T1. The CMPr signal does not rise yet. For this reason, the DOWN signal rises at timing T1. As a result, the delay control circuit 160 gradually decreases the voltage value of the outputting CNT signal from the same timing T1.

Timing 2 is timing at which the OUTr signal falls and is below the threshold voltage Vref. At timing T3, the CMPf signal rises and the phase comparing circuit 150 causes the DOWN signal to fall in response to the rise of the CMPf signal. As a result, the delay control circuit 160 keeps the voltage value of the outputting CNT signal at the level after timing T2.

The delay control circuit 160 decreases the voltage value of the CNT signal, so that the through rates at which the respective signals, which are output from the replica output buffers 120, 121 and the output buffer 180, fall are adjusted to be decreased.

When the voltage of the CNT voltage is varied, the through rates at which the respective signals, which are output from the replica output buffers 120 and 121, fall are varied in such a way that delay time when the signal rises is the same as delay time when the signal falls. The input/output characteristic of each of the replica output buffers 120 and 121 are the same as that of the output buffer 180. For this reason, when the delay time when the replica output buffer 120 (121) rises is the same as the delay time when the replica output buffer 120 (121) falls, when delay time when the output buffer 180 rises is the same as delay time when the replica output buffer 180 fills.

As explained above, the replica output buffers 120 and 121, which have the same input/output characteristic as that of the output buffer 180, are provided, and the through rate at which the signal output from the output buffer 180 falls is varied according to the phase difference between the signals output from the replica output buffers 120 and 121. Accordingly, delay time when the output buffet 180 rises can be set to the same as delay time when the output buffer 180 falls at the receiving side.

This produces a margin for reducing the set-up time and the hold time when data is received by the receiving side, so that a transmission frequency can be improved.

Additionally, the present invention is not limited to the aforementioned embodiment and various modifications and applications may be possible.

Figure 5:
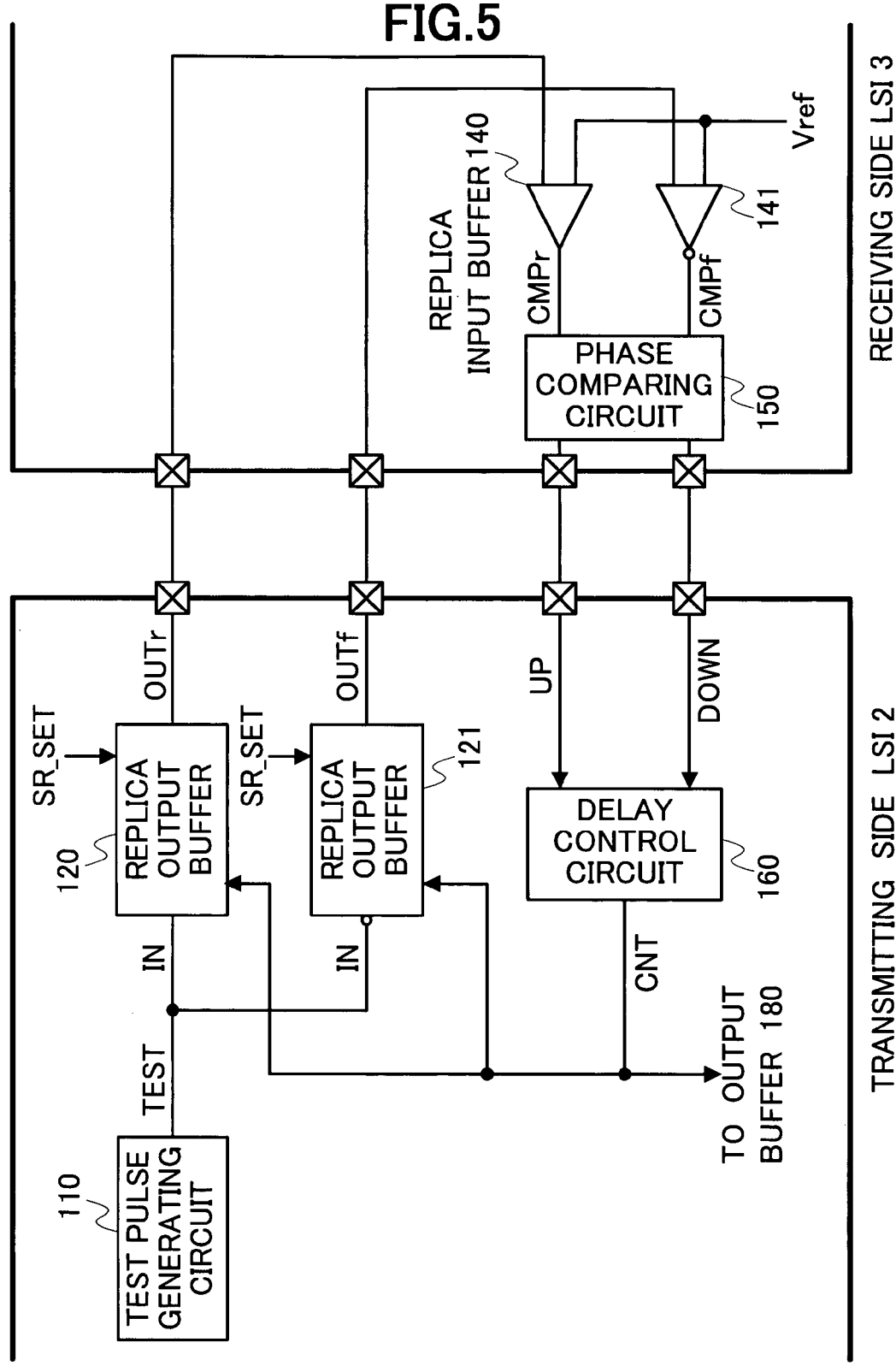
FIG. 5 is a block diagram illustrating a modification example of an output buffer circuit according to an embodiment of the present invention.

For example, as illustrated in FIG. 5, the test pulse generating circuit 110, the replica output buffers 120, 121, and the delay control circuit 160 may be included in the LSI 2 of the transmitting side, and the replica input buffer 140 and the phase comparing circuit 150 may be included in the LSI 3 of the receiving side. This makes it possible to compensate for variations in an operation of the input buffer at the receiving side and increase a margin of speed-up.

Moreover, instead of adjusting the through rate at which the signal falls, it is possible to adjust the through rate at which the signal rises. In this case, the SR_SET signal and the CNT signal, which are input to the replica output buffers 120, 121, and the output buffer 180, are exchanged. Furthermore, when the phase of the CMPf signal advances than the phase of the CMPr signal, the phase comparing circuit 150 outputs the UP signal, indicative of this fact, to the delay control circuit 160. When the phase of the CMPf signal is delayed than the phase of the CMPr signal, the phase comparing circuit 150 outputs the DOWN signal, indicative of this fact, to the delay control circuit 160.

Regarding the increase and decrease in the voltage value of the CNT signal and the high-level signal and the low-level signal of the aforementioned each signal, the meaning may be given thereto in any way if the same result as that of the aforementioned embodiment can be obtained. Moreover, the same can be applied to the configurations of the logic gate and the sequential circuit.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2004-103387 filed on Mar. 31, 2004 and including specification, claims, drawings and summary. The disclosure of the above Japanese Patent Application is incorporated herein by reference in its entirety.

What is claimed is:

1. An output buffer circuit comprising:
   an output buffer which outputs input data at a through rate according to a control signal;
   a pulse generating circuit which generates a test pulse;
   two replica buffers which operate each other in opposite phase, which have the same input/output characteristic as that of said output buffer, and which input the test pulse generated by said pulse generating circuit to output the test pulse at the through rate according to the control signal; and
   a through rate control circuit which varies the control signal according to a phase difference between output signals of said two replica buffers to output the control signal to said output buffer and said two replica buffers.

2. The output buffer circuit according to claim 1, wherein said through rate control circuit includes a phase comparing circuit that detects timing at which signal levels of output signals of said replica buffers are the same as a predetermined reference level to output a phase difference signal corresponding to a phase difference in the timing, and varies a control voltage value that is output according to the phase difference signal output by said phase comparing circuit.

3. A semiconductor integrated circuit that integrates an output buffer circuit on a semiconductor substrate, said output buffer circuit comprising:
   a pulse generating circuit which generates a test pulse;
   two replica buffers which operate each other in opposite phase, each which has the same input/output characteristic as that of said output buffer, and each which inputs the test pulse generated by said pulse generating circuit to output the test pulse;
   a buffer through rate control circuit which varies a control voltage according to a phase difference between test signals output by said two replica buffers to output the control voltage; and
   an output buffer which adjusts a through rate of a data signal output according to the control voltage output by said buffer through rate control circuit,
   wherein said two replica buffers adjust the through rate of the test signal output according to the control voltage output by said buffer through rate control circuit.

* * * * *